United States Patent [19]
Pan

[11] Patent Number: 5,652,177
[45] Date of Patent: Jul. 29, 1997

[54] METHOD FOR FABRICATING A PLANAR FIELD OXIDE REGION

[75] Inventor: Yang Pan, Singapore, Singapore

[73] Assignee: Chartered Semiconductor Manufacturing PTE LTD, Singapore, Singapore

[21] Appl. No.: 701,606

[22] Filed: Aug. 22, 1996

[51] Int. Cl.$^6$ .................................................. H01L 21/76
[52] U.S. Cl. .............................. 437/69; 437/70; 437/968
[58] Field of Search .................................. 437/69, 70, 72, 437/73, 968

[56] References Cited

U.S. PATENT DOCUMENTS

| | | | |
|---|---|---|---|
| 4,612,701 | 9/1986 | Cox | 437/72 |
| 4,952,525 | 8/1990 | van der Plas | 437/69 |
| 5,374,585 | 12/1994 | Smith et al. | 437/69 |
| 5,470,783 | 11/1995 | Chiu et al. | 437/67 |
| 5,472,905 | 12/1995 | Paek et al. | 437/69 |
| 5,554,560 | 9/1996 | Hsue et al. | 437/69 |

*Primary Examiner*—Trung Dang
*Attorney, Agent, or Firm*—George O. Saile; William J. Stoffel

[57] ABSTRACT

The present provides a method of manufacturing a planar field isolation region using a polysilicon layer as a polishing stop. The method begins by sequentially forming an insulating layer 12, a polysilicon layer 14 and a nitride layer 16 over a primary surface of a substrate 10. The polysilicon layer 14 and the nitride layer 16 are patterned to form a first opening exposing insulating layer 12. A field isolation region is grown to a first thickness within the first opening. The nitride layer is removed. The field isolation region is polished so that the top surface of the field isolation region is coplanar with the top surface of the polysilicon layer. Next the polysilicon layer is removed by either of two embodiments. First, the polysilicon is removed by a second (CMP) polishing step which uses a different slurry than the field oxide CMP. The second CMP step the exposed surface of the field isolation region is coplanar with an exposed surface of the polysilicon layer. Second, the polysilicon layer can be removed by a selective etch.

31 Claims, 2 Drawing Sheets

METHOD FOR FABRICATING A PLANAR FIELD OXIDE REGION

BACKGROUND OF THE INVENTION

1) Field of the Invention

The present invention relates in general to methods for the formation of a device separation film among manufacturing processes for a semiconductor device and more particularly to methods for forming a field oxide fill in the semiconductor device.

2) Description of the Prior Art

The fabrication of an integrated circuit normally begins by processing the semiconductor substrate or wafer to divide the surface area into regions where active devices and substrate embedded interconnects are to be formed, and other regions of dielectric (e.g., field oxide regions) which electrically separate the active regions. The field oxide dielectric material is routinely silicon dioxide. Though various field oxide formation techniques have been developed and described, the technique commonly known as the localized oxidation of silicon (LOCOS) remains common therein the semiconductor industry. In the practice of LOCOS, the active regions of the silicon substrate are masked by a silicon nitride layer, while the field oxide regions are thermally oxidized to form a field dielectric region. Though fundamentally simple and efficient, the LOCOS process and its progeny, such as the Fully Recessed LOCOS (FUROX) and sidewall masked isolation (SWAMI) techniques, exhibit deficiencies which reduce yield or performance in the final semiconductor chip product.

A major problem with current field oxidation processes is that the field oxide is not planar (or coplanar) with the surrounding adjacent surface which causes problems in the overlying layers. Semiconductor devices require more levels of interconnects as component densities within the devices increase. A conventional LOCal Oxidation of Silicon (LOCOS) field isolation process may cause problems because the field isolation regions may have too much of a step height change that may make subsequent planarization steps required or more difficult.

LOCOS-type field isolation processes may cause additional problems when subsequently patterning a layer to form a gate electrode because reflective notching may occur. The changes in topography between a substrate and LOCOS-type of field isolation regions cause light to reflect and form notches in a masking layer pattern used to form a gate electrode. The mask pattern may have a feature with an uniform width, but the pattern formed in the masking layer by that mask may have a width that narrows near the edge of a field isolation region because of the reflective notching. The pattern in the masking layer is transferred to the conductive layer when the conductive layer is etched to form the gate electrode. This difference between the pattern of the mask and the gate electrode is undesired.

Other field isolation process have been developed that require etching a semiconductor substrate. There other processes, including trench isolation, semi-recessed or fully-recessed LOCOS processes, sidewall masked isolation (SWAMI) and the like, all require some type of substrate etch. Trenches in the substrate may not have uniform depths. Narrow trenches may not be formed to the same depth as wider trenches because the concentration of ions (of a plasma) is typically lowered for the narrower trench. Therefore, narrow trenches will be shallower than wider trenches. This effect is call "lag". Another problem with a substrate etch is that typically an endpoint does not exist.

The depth of the substrate trench may be variable both across a substrate and between substrates in the same lot. A lack of control for the substrate etch poses step height problems for which no good solution exists.

The importance of overcoming the various deficiencies noted above is evidenced by the extensive technological development directed to the subject, as documented by the relevant patent and technical literature. The closest and apparently more relevant technical developments in the patent literature can be gleaned by considering U.S. Pat. No. 4,952,525 (Van der Plas) and U.S. Pat. No. 5,374,585 (Smith et al.). Van der Plas forms a FOX region that is thicker than the desired final thickness so that subsequent RIE etchings leave the FOX with the desired thickness. Smith uses the silicon nitride oxidation masking layer as a CMP stopping layer. However, Smith subjects the FOX to subsequent etches that can overetch the FOX and cause FOX integrity problem, especially around the edges to the FOX. However, the prior art processes can be further improved upon. Though a number to the prior art techniques attempt solve the non-planarity problem and usually provide relatively planar final concluding surfaces, the approaches can be improved upon.

SUMMARY OF THE INVENTION

It is an object of the present invention to provide a method for fabricating field oxide regions which have a planar surface and a small step height with respect to the adjacent substrate surface.

It is an object of the present invention to provide a method for fabricating a field oxide region using a chemical mechanical polishing process with a polysilicon polish stopper layer.

To accomplish the above objectives, the present invention provides a method of manufacturing a planar field isolation region. The method begins by sequentially forming an insulating layer, a polysilicon layer and a nitride layer over a primary surface of a substrate. The insulating layer, the silicon layer (e.g., a polysilicon layer) and the nitride layer are patterned to form a first opening exposing the substrate. A field isolation region is grown to a first thickness within the first opening. The nitride layer is then removed. In an important step, the field isolation region is polished, using the silicon layer as a polishing stop, so that the top surface of the field isolation region is coplanar with the top surface of the polysilicon layer. Next the silicon layer is removed by either of two embodiments. First, preferably the polysilicon is removed by a polishing technique which includes polishing the field oxide region and the silicon layer so that the exposed surface of the field isolation region is coplanar with an exposed surface of the silicon layer. Second, the silicon layer can be removed using a selective etch.

The present invention provides a technique to form a planar field isolation layer. The top surface of field oxide is very near coplanar with the substrate surface because the invention uses a thin polysilicon layer as a polishing etch stop. The invention does not have the problems associated with etching back the field oxide region after a CMP process where thicker, and higher layers are used as etch stops.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunc

It should be also understood that the figures depict only one field oxide region out of a multitude of field oxide regions that are fabricated simultaneously on the substrate.

DETAILED DESCRIPTION OF THE PREFERRED EMBODIMENTS

The present invention will be described in detail with reference to the accompanying drawings. The present invention provides a method of forming a planar field isolation region that is parallel to the primary surface of a substrate at locations spaced away from the field isolation region. The invention forms field isolation regions that have top surface heights that are very closer to substrate surface heights without using a field isolation region etch back.

Figure 1:
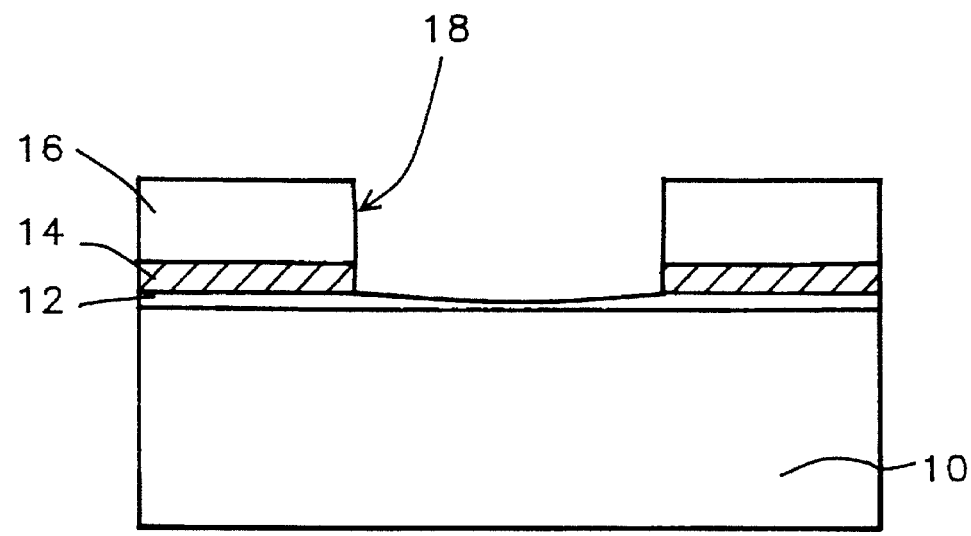
- FIGS. 1 through 5 are cross sectional views for illustrating a method for fabricating the field isolation region according to the present invention.

FIG. 1 shows a cross-sectional view of a portion of a semiconductor substrate 10. The substrate has primary surface with a first topology. The substrate 10 is preferably a p-type semiconductor substrate with a (100) crystal orientation.

An insulating layer 12 is formed over the substrate surface. The insulating layer 12 may include one or more layers of oxide, nitride, or nitride oxide. The insulating layer is preferably formed of silicon oxide. The insulating layer is preferably formed by thermal growth or deposition. The preferably the insulating layer has a thickness in a range of between about 100 and 500 Å.

Next, a silicon layer 14 is formed over the insulating layer 14. The silicon layer may include polysilicon, or amorphous silicon. The silicon layer preferably has thickness in a range of between about 100 and 800 Å and is more preferably between about 300 and 400Å. The polysilicon layer can be deposited by pyrolyzing silane in a low pressure chemical vapor deposition process at a temperature less than 600° C. The polysilicon layer 14 is more preferably formed by reacting SiH4 at a temperature of between about 600° and 800° C.

Still referring to FIG. 1, a silicon nitride layer 16 is formed over the polysilicon layer 14. The silicon nitride layer may be a stoichiometric or non-stoichiometric, such as silicon-rich silicon nitride and nitrogen-rich silicon nitride. The silicon nitride layer 16 preferably has a thickness in a range of between about 1000 and 2000 Å. The silicon nitride layer 16 can be formed by reacting silane and ammonia at atmospheric pressure at 700° to 900° C., or by reacting dichlorosilane and ammonia at reduced pressure at between about 750° and 800° C. and more preferably about 700° C. Also, silicon nitride can be formed by plasma enhance chemical vapor deposition by reacting silane with ammonia or nitrogen in a glow discharge between 200° and 350° C. The silicon nitride layer 16 is preferably formed by the LPCVD process.

Next, a first opening 18 is formed in the silicon layer 14 and nitride layer 16. Preferably the first opening 18 exposes preferably the insulating layer 12 (e.g., oxide) surface. The first opening can be formed using a conventional photo coat, expose and etch process.

Figure 2:
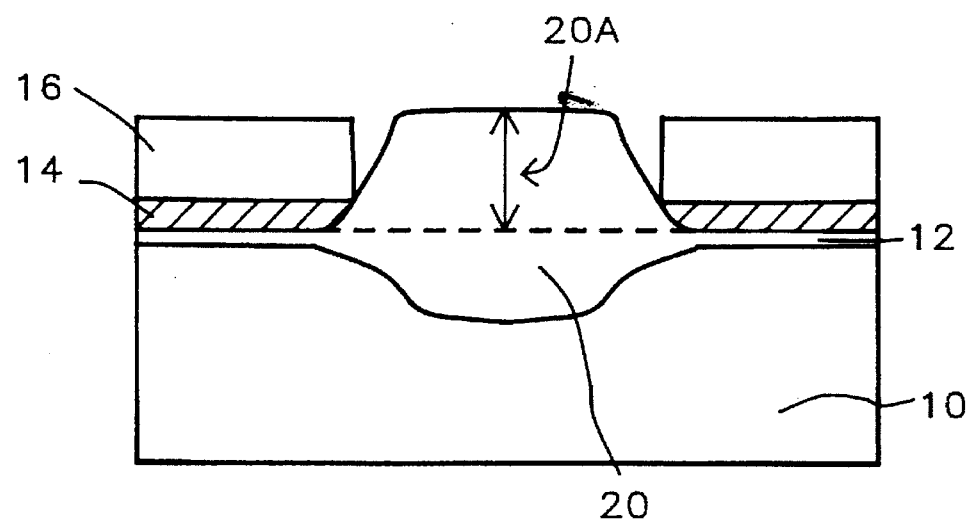

As shown in FIG. 2, a field oxide region 20 is thermally grown from a portion of the substrate 10 in the first opening. The field oxidation is preferably formed using a thermal oxidation at a temperature preferably between about 850° and 1150° C. and more preferably formed at a high temperature of between about 1050° and 1150° C. to reduce the bird's beak problem. The field oxide region 20 is more preferably formed in a high pressure thermal oxidation process which is performed at a pressure in the range of 23 to 27 ATM and more preferably about 25 atmospheres. The high pressure FOX process reduces the size of the bird's beak. Also, a portion of the polysilicon layer 14 near the first opening is consumed in the oxidation which reduces the bird's peak problem. The field oxide region 20 preferably has a thickness in a range of between about 4000 and 6000 Å. The field isolation region preferably has a height 20A above the substrate surface 10 of between about 2000 and 4000 Å.

Figure 3:
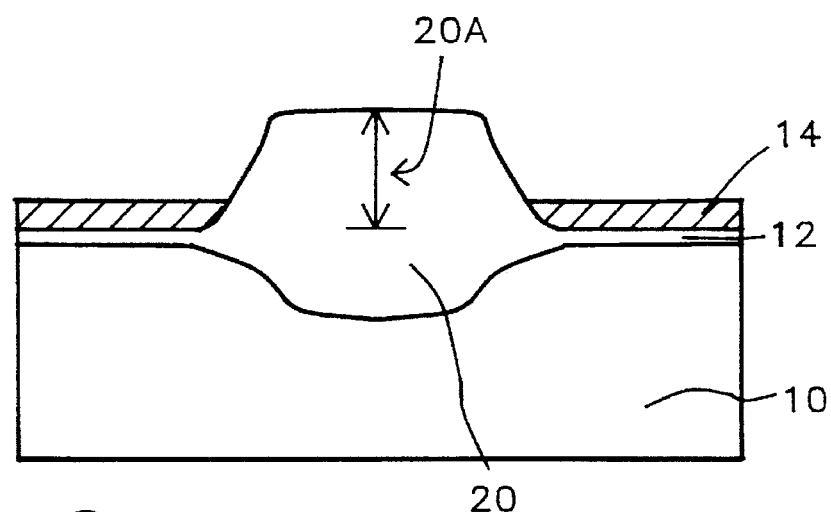

Referring to FIG. 3, the silicon nitride layer 16 is removed. The silicon nitride is preferably removed using an etch that is selective to silicon nitride, such as an etch using a fluorine-containing etch chemistry, such as carbon tetrafluoride (CF), nitrogen trifluoride ($NF_3$) and the like.

Figure 4:
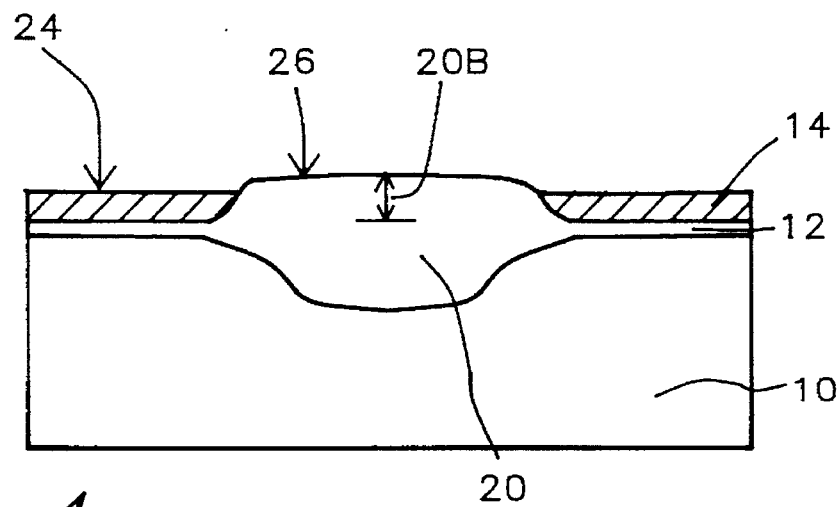

Turning to FIG. 4, the field isolation region 20 is polished to form a planar top surface 26. The field oxide 20 and a portion of the polysilicon layer 14 are polished. The polish is performed by preferably chemical-mechanical polishing (CMP). The polishing is preferably performed at a substrate holder pressure in a range of 250 to 350 lbs per square inch and a platen rotational velocity of between about 20 and 60 RPM. The polishing is preferably performed with a polishing solution including a hydroxide and silica particles and the polishing solution preferably has a pH in a range of 9.5 to 10.0. During the polishing, it is desired to achieve a relatively flat surfaces 26. As can be seen in FIG. 4, the field isolation region surface 26 and the surface portions 24 of the silicon layer 14 are coplanar. The surface portions 24 of the silicon layer 14 act as a polish stop. The polishing stop may be determined by a significant increase in force need to rotate the substrates or a step function decrease in the polishing rate of the field isolation region 20. Other methods may be used to detect the endpoint. In any event, the polishing should remove a relatively small portion of the silicon layer 14 away from the field isolation region 20. The polishing step removes in a range of between about 1500 and 3500 Å of the field isolation region 20. After the polishing, the field isolation region has a height 20B above the substrate surface 10 of between about 100 and 300 Å. The field isolation layer preferably has a overall thickness in a range of between about 1500 and 3000 Å.

The polishing (CMP) is preferably performed with a polishing slurry that is typically basic and has a pH in a range of 9.5 to 10.0. The polishing slurry typically include a hydroxyl chemical in an aqueous solution with particles. Example of the hydroxyl chemical may include potassium hydroxide, ammonium hydroxide, or the like. The particles are typically silica particles but may also include or be replaced by alumina particles.

Figure 5:
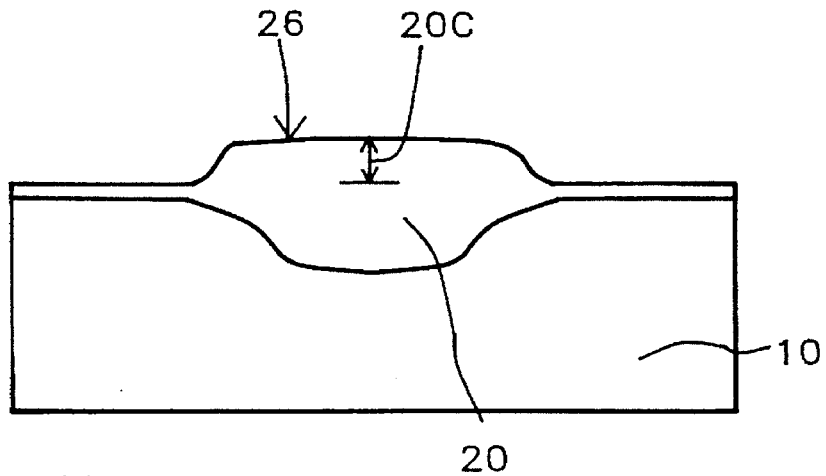

As shown in FIG. 5, the silicon layer 14 is removed. The invention provides two embodiments for removing the silicon layer. The silicon layer 14 can be removed by (1) a polishing process or (2) by an etching process.

In the first embodiment, the silicon layer 14 is preferably removed in a second chemical-mechanical polishing (CMP) step after the field isolation region planarization (CMP) as describe above. The CMP process to remove the silicon layer 14 preferably uses a different slurry than the first CMP step which removes the field oxide. The polishing is preferably performed at a substrate holder pressure in of between about 250 to 350 lbs per square inch and a platen rotational velocity of between about 20 and 60 RPM. The polishing is preferably performed with a polishing solution including a hydroxide and silica particles, and the polishing solution has a pH in a range of between about 9.5 to 10.0. The chemical-mechanical polish process has the advantage of removing polysilicon particles that are formed during the field oxidation process which uses a polysilicon layer 14 (e.g., Polysilicon Buffered LOCOS, PBL). An etch will not remove the polysilicon particles generated by the LOCOS process as well as the CMP processes. Any polysilicon particles remaining can lower yields.

In the second embodiment, the polysilicon layer 14 is removed using a selective wet or dry etch. The examples below are for illustrative purposes and not meant to limit the present invention. The silicon layer can be removed in a dry etch process by using a fluorine-containing etch chemistry or a bromine-containing etch chemistry, such as $CF_2Cl_2$, $CF_4 + O_2$, $C_2F_6$, and $Cl_2$. The etch removal of the polysilicon layer 14 has the disadvantages slightly etching the field isolation region and not removing the polysilicon particles from the LOCOS process.

Next, conventional metal oxide semiconductor (MOS), bipolar, or other semiconductor processing may be performed. Often a sacrificial oxide may be grown and removed from the substrate 10 prior to forming a gate dielectric layer (not shown) or other subsequent layers (Not shown). These processing sequences are known to those skilled in the art. In addition, the substrate can contain other devices, such as wells and buried isolation doped regions as is known to those skilled in the art.

While the invention has been particularly shown and described with reference to the preferred embodiments thereof, it will be understood by those skilled in the art that various changes in form and details may be made without departing from the spirit and scope of the invention.

What is claimed is:

1. A process for forming field isolation regions on a substrate comprising the steps:
   a) sequentially forming an insulating layer, a silicon layer and a nitride layer over a primary surface of a substrate;
   b) patterning said silicon layer and said nitride layer to form a first opening exposing said insulating layer;
   c) growing a field isolation region to a first thickness within said first opening;
   d) removing said nitride layer; and
   e) polishing said field isolation region so that the top surface of said field isolation region is coplanar with the top surface of said silicon layer, said field oxide region having a second thickness.

2. The method of claim 1 wherein the method further includes polishing said field isolation region and said silicon layer to remove said silicon layer, wherein after this step: an exposed surface of said field isolation region is coplanar with an exposed surface of said insulating layer, said field isolation region having a third thickness.

3. The method of claim 2 wherein after said field isolation region layer is polished, using the silicon layer as an etch stop, said field isolation layer has a third thickness in a range of between about 1500 and 3000 Å.

4. The method of claim 2 wherein the polishing of said field isolation region and said silicon layer is performed at a substrate holder pressure in of between about 250 to 350 lbs per square inch and a platen rotational velocity of between about 20 and 60 RPM.

5. The method of claim 2 wherein the polishing of said field isolation region and said silicon layer is performed with a polishing solution including a hydroxide and silica particles and the polishing solution has a pH in a range of between about 9.5 to 10.0.

6. The method of claim 1 wherein said insulating layer is comprised of silicon oxide and has a thickness in a range of between about 100 and 500 Å.

7. The method of claim 1 wherein said silicon layer is composed of polysilicon and has a thickness in a range of between about 100 and 800 Å.

8. The method of claim 1 wherein said nitride layer a thickness in a range of between about 1000 and 2000 Å.

9. The method of claim 1 wherein after step (c) said field oxide region has a first thickness in a range of between about 4000 and 6000 Å.

10. The method of claim 1 wherein after step (e) said field oxide regions has a second thickness in a range of between about 1500 and 3000 Å.

11. The method of claim 1 wherein said polishing is step (e) removes between about 1500 to 3500 Å of said field oxide region.

12. The method of claim 1 wherein the polishing in step (e) is performed at a substrate holder pressure in a range of 250 to 350 lbs per square inch and a platen rotational velocity of between about 20 and 60 RPM.

13. The method of claim 1 wherein the polishing in step (e) is performed with a polishing solution including a hydroxide and silica particles and the polishing solution has a pH in a range of 9.5 to 10.0.

14. A process for forming a field isolation regions on a substrate comprising the steps of:
   a) sequentially forming an insulating layer, a silicon layer and a nitride layer over a primary surface of a substrate, said insulating layer is composed of silicon oxide, said silicon layer formed of polysilicon;
   b) patterning said insulating layer, said silicon layer and said nitride layer to form a first opening exposing said substrate;
   e) growing a field isolation region to a first thickness within said first opening;
   d) removing said nitride layer;
   e) polishing said field isolation region using said silicon layer as a polishing stop; and
   f) polishing said field isolation region and said silicon layer to remove said silicon layer, wherein after this step an exposed surface of said field isolation region is coplanar with an exposed surface of said insulating layer, said field isolation region having a third thickness.

15. The method of claim 14 wherein step (f) further includes the polishing performed at a substrate holder pressure in of between about 250 to 350 lbs per square inch and a platen rotational velocity of between about 20 and 60 RPM.

16. The method of claim 14 wherein step (f) further includes the polishing performed with a polishing solution including a hydroxide and silica particles and the polishing solution has a pH in a range of between about 9.5 to 10.0.

17. The method of claim 14 wherein said insulating layer 12 is comprised of silicon oxide and has a thickness in a range of between about 100 and 500 Å.

18. The method of claim 14 wherein said silicon layer 14 is composed of polysilicon and has a thickness in a range of between about 100 and 800 Å.

19. The method of claim 14 wherein said nitride layer 16 a thickness in a range of between about 1000 and 2000 Å.

20. The method of claim 14 wherein after step (e) said field oxide region has a first thickness in a range of between about 4000 and 6000 Å.

21. The method of claim 14 wherein after step (e) said field oxide regions has a second thickness in a range of between about 1500 and 3000 Å.

22. The method of claim 14 wherein said polishing is step (e) removes between about 1500 to 3500 Å of said field oxide region.

23. The method of claim 14 wherein the polishing in step (e) is performed at a substrate holder pressure in a range of 250 to 350 lbs per square inch and a platen rotational velocity of between about 20 and 60 RPM.

24. The method of claim 14 wherein the polishing in step (e) is performed with a polishing solution including a hydroxide and silica particles and the polishing solution has a pH in a range of 9.5 to 10.0.

25. A process for forming a field isolation regions on a substrate comprising the steps of:
   a) sequentially forming an insulating layer, a silicon layer and a nitride layer over a primary surface of a substrate, said insulating layer is composed of silicon oxide, said silicon layer formed of polysilicon and has a thickness in a range of between about 100 and 800 Å;
   b) patterning said insulating layer, said silicon layer and said nitride layer to form a first opening exposing said substrate;
   c) growing a field isolation region to a first thickness within said first opening;
   d) removing said nitride layer;
   e) polishing said field isolation region using said silicon layer as a polishing stop; the polishing performed at a substrate holder pressure in a range of 250 to 350 lbs per square inch and a platen rotational velocity of between about 20 and 60 RPM. and with a polishing solution including a hydroxide and silica particles and the polishing solution has a pH in a range of 9.5 to 10.0; and
   f) polishing said field isolation region and said silicon layer to remove said silicon layer, wherein after this step: an exposed surface of said field isolation region is coplanar with an exposed surface of said insulating layer, said field isolation region having a third thickness, the polishing performed at a substrate holder pressure in of between about 250 to 350 lbs per square inch and a platen rotational velocity of between about 20 and 60 RPM. and the polishing performed with a polishing solution including a hydroxide and silica particles and the polishing solution has a pH in a range of between about 9.5 to 10.0.

26. The method of claim 25 wherein after step (e) said field isolation layer has a third thickness in a range of between about 1500 and 3000 Å.

27. The method of claim 25 wherein said insulating layer is comprised of silicon oxide and has a thickness in a range of between about 100 and 500 Å.

28. The method of claim 25 wherein said nitride layer a thickness in a range of between about 1000 and 2000 Å.

29. The method of claim 25 wherein after step (c) said field oxide region has a first thickness in a range of between about 4000 and 6000 Å.

30. The method of claim 25 wherein after step (e) said field oxide regions has a second thickness in a range of between about 1500 and 3000 Å.

31. The method of claim 25 wherein said polishing is step (e) removes between about 1500 to 3500 Å of said field oxide region.

* * * * *